United States Patent
Wang et al.

(10) Patent No.: US 11,011,132 B2
(45) Date of Patent: May 18, 2021

(54) SHIFT REGISTER UNIT, SHIFT REGISTER CIRCUIT, DRIVING METHOD, AND DISPLAY APPARATUS

(71) Applicants: BOE Technology Group Co., Ltd., Beijing (CN); Ordos Yuansheng Optoelectronics Co., Ltd., Inner Mongolia (CN)

(72) Inventors: Zhen Wang, Beijing (CN); Jian Sun, Beijing (CN); Fei Huang, Beijing (CN); Xiaozhou Zhan, Beijing (CN); Yun Qiao, Beijing (CN); Han Zhang, Beijing (CN); Wenwen Qin, Beijing (CN); Lele Cong, Beijing (CN); Zhengkui Wang, Beijing (CN); Rui Liu, Beijing (CN); Pengjun Chen, Beijing (CN); Lidong Wang, Beijing (CN); Shuang Zhao, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 262 days.

(21) Appl. No.: 16/071,964

(22) PCT Filed: Nov. 3, 2017

(86) PCT No.: PCT/CN2017/109260
§ 371 (c)(1),
(2) Date: Jul. 23, 2018

(87) PCT Pub. No.: WO2018/196317
PCT Pub. Date: Nov. 1, 2018

(65) Prior Publication Data
US 2020/0211496 A1 Jul. 2, 2020

(30) Foreign Application Priority Data

Apr. 27, 2017 (CN) .......................... 201710289777.8

(51) Int. Cl.
*G09G 5/00* (2006.01)
*G11C 19/28* (2006.01)

(52) U.S. Cl.
CPC .............. *G09G 5/006* (2013.01); *G11C 19/28* (2013.01); *G09G 2310/0286* (2013.01); *G09G 2330/026* (2013.01)

(58) Field of Classification Search
CPC ........... G09G 5/006; G09G 2310/0286; G09G 2330/026; G11C 19/28
See application file for complete search history.

(56) References Cited

U.S. PATENT DOCUMENTS 9,627,089 B2    4/2017    Qi et al.
10,121,436 B2    11/2018    Huang et al.
(Continued)

FOREIGN PATENT DOCUMENTS

CN    103943054 A    7/2014
CN    103996367 A    8/2014
(Continued)

OTHER PUBLICATIONS

International Search Report and Written Opinion for International Application No. PCT/CN2017/109260, dated Jan. 31, 2018, 22 pages.
(Continued)

*Primary Examiner* — Sahlu Okebato
(74) *Attorney, Agent, or Firm* — Westman, Champlin & Koehler, P.A.

(57) ABSTRACT

The present application provides a shift register unit, a shift register circuit, a driving method, and a display apparatus, and relates to the field of display technology. The method
(Continued)

includes: in a reset phase in which a second node is at a first level, transmitting, by a control circuit, a second level signal to a first node and an output signal terminal under the control of a voltage at the second node; and in a normal operation phase, normally operating, by the shift register unit.

15 Claims, 6 Drawing Sheets

(56) References Cited

U.S. PATENT DOCUMENTS

| | | |
|---|---|---|
| 2015/0213762 A1 | 7/2015 | Xia et al. |
| 2015/0302934 A1* | 10/2015 | Qi .................. G11C 19/184 377/54 |
| 2015/0318052 A1* | 11/2015 | Li ..................... G11C 19/28 377/64 |
| 2017/0178581 A1 | 6/2017 | Li et al. |
| 2017/0256217 A1 | 9/2017 | Xiao et al. |
| 2018/0040382 A1 | 2/2018 | Gu et al. |
| 2018/0122289 A1 | 5/2018 | Gu et al. |
| 2018/0226132 A1 | 8/2018 | Gao et al. |

FOREIGN PATENT DOCUMENTS

| | | |
|---|---|---|
| CN | 104575419 A | 4/2015 |
| CN | 104700803 A | 6/2015 |
| CN | 104966506 A | 10/2015 |
| CN | 105047158 A | 11/2015 |
| CN | 106023914 A | 10/2016 |
| CN | 106023946 A | 10/2016 |
| CN | 106128347 A | 11/2016 |
| CN | 106409207 A | 2/2017 |
| CN | 106448533 A | 2/2017 |
| CN | 106504720 A | 3/2017 |
| CN | 106952603 A | 7/2017 |
| KR | 10-2005-0118084 A | 12/2005 |
| WO | 2014/193102 A1 | 12/2014 |

OTHER PUBLICATIONS

First Office Action, including Search Report, for Chinese Patent Application No. 201710289777.8, dated Apr. 24, 2019, 25 pages.

* cited by examiner

SHIFT REGISTER UNIT, SHIFT REGISTER CIRCUIT, DRIVING METHOD, AND DISPLAY APPARATUS

CROSS-REFERENCE TO RELATED APPLICATION(S)

This application is a Section 371 National Stage Application of International Application No. PCT/CN2017/109260, filed on Nov. 3, 2017, entitled "SHIFT REGISTER UNIT, SHIFT REGISTER CIRCUIT, DRIVING METHOD, AND DISPLAY APPARATUS", which has not yet published, and claims priority to the Chinese Patent Application No. 201710289777.8, filed on Apr. 27, 2017, which are incorporated herein by reference in their entireties.

TECHNICAL FIELD

The present disclosure relates to the field of display technology, and more particularly, to a shift register unit, a shift register circuit, a driving method, and a display apparatus.

BACKGROUND

In recent years, in the field of displays, a gate driving circuit is integrated on an array substrate of a display panel by using a Gate Driver on Array (GOA for short) technology. Such a gate switch circuit integrated on the array substrate using the GOA technology is also referred to as a GOA circuit or a shift register unit circuit, and each of shift register units in the gate switch circuit is referred to as a GOA circuit or a shift register unit.

SUMMARY

The embodiments of the present disclosure provide a shift register unit, a shift register circuit, a driving method, and a display apparatus.

According to a first aspect of the present disclosure, there is provided a shift register unit for a display panel, comprising an input circuit connected to a first level terminal, an input signal terminal configured to provide an input signal, and a first node; a control circuit connected to a first clock signal terminal, an output signal terminal, a third level terminal, the first node, and a second node; an output circuit connected to a second clock signal terminal, the first node, the second node, the third level terminal, and the output signal terminal; and a starting-up reset circuit connected to a starting-up signal terminal configured to provide a starting-up signal, the output signal terminal, the second node, and the third level terminal, wherein, the starting-up reset circuit is configured to transmit a voltage at the third level terminal to the second node and output, at the output signal terminal, the starting-up signal under a control of the starting-up signal;

the input circuit is configured to transmit a voltage at the first level terminal to the first node under a control of the input signal; and the control circuit is configured to transmit a first clock signal at the first clock signal terminal to the second node under a control of a voltage at the first node, a voltage at the output signal terminal, and the first clock signal at the first clock signal terminal, and transmit the voltage at the third level terminal to the first node under a control of a voltage at the second node; and the output circuit is configured to transmit the voltage at the third level terminal to the output signal terminal under the control of the voltage at the second node.

In an example, the input circuit comprises a first transistor having a first electrode connected to the first level terminal, a second electrode connected to the first node, and a gate connected to the input signal terminal.

In an example, the shift register unit further comprises a reset circuit connected to a second level terminal, a reset signal terminal configured to provide a reset signal, and the first node. The reset circuit is configured to transmit a voltage at the second level terminal to the first node under a control of the reset signal.

In an example, the reset circuit reset circuit comprises a second transistor having a first electrode connected to the second level terminal, a second electrode connected to the first node, and a gate connected to the reset signal terminal.

In an example, the control circuit comprises a third transistor, a fourth transistor, a fifth transistor, a sixth transistor, and a first capacitor, wherein the third transistor has a first electrode connected to the first clock signal terminal, a second electrode connected to the second node, and a gate connected to the first clock signal terminal; the fourth transistor has a first electrode connected to the first node, a second electrode connected to the third level terminal, and a gate connected to the second node; the fifth transistor has a first electrode connected to the first node, a second electrode connected to the third level terminal, and a gate connected to the first node; the sixth transistor has a first electrode connected to the second node, a second electrode connected to the third level terminal, and a gate connected to the output signal terminal; and the first capacitor has a first electrode connected to the second node, and a second electrode connected to the third level terminal.

In an example, the output circuit comprises a seventh transistor, an eighth transistor, and a second capacitor, wherein the seventh transistor has a first electrode connected to the output signal terminal, a second electrode connected to the third level terminal, and a gate connected to the second node; the eighth transistor has a first electrode connected to the second clock signal terminal, a second electrode connected to the output signal terminal, and a gate connected to the first node; and the second capacitor has a first electrode connected to the first node, and a second electrode connected to the output signal terminal.

In an example, the starting-up reset circuit comprises a ninth transistor and a tenth transistor, wherein the ninth transistor has a first electrode connected to the output signal terminal, a second electrode connected to the starting-up signal terminal, and a gate connected to the starting-up signal terminal; and the tenth transistor has a first electrode connected to the second node, a second electrode connected to the third level terminal, and a gate connected to the starting-up signal terminal.

In an example, each transistor of the shift register unit is an N-type transistor, the first level is a high level, and the second level is a low level.

In an example, each transistor of the shift register unit is a P-type transistor, the first level is a low level, and the second level is a high level.

According to a second aspect of the present disclosure, there is provided a method for driving a shift register unit of the present disclosure, the driving method comprising:

in a starting-up reset phase, causing both the first node and the second node to be at the second level under the control of the starting-up reset circuit.

In an example, the shift register unit further comprises a reset circuit, and subsequent to the starting-up reset phase, the method further comprise:

a reset phase in which the second node is at a first level, transmitting, by the control circuit, a second level signal to the first node and the output signal terminal under the control of a voltage at the second node.

In an example, the second node is at the first level, and transmitting, by the control circuit, a second level signal to the first node and the output signal terminal under the control of a voltage at the second node comprises:

transmitting, by the control circuit, the first level to the second node under the control of a voltage at the first node and a voltage at the output signal terminal, and transmitting the second level to the first node and the output signal terminal under the control of the voltage at the second node.

In an example, in the starting-up reset phase, causing both the first node and the second node to be at the second level under the control of the starting-up reset circuit comprises: transmitting, by the starting-up reset circuit, the first level to the output signal terminal, and transmitting the second level to the second node; and transmitting, by the reset circuit and the input circuit, the second level to the first node.

In an example, the method further comprises a normal operation phase comprising:

a first normal operation sub-period in which the input circuit transmits the first level to the first node, and the control circuit transmits the second level to the second node under the control of the voltage at the first node;

a second normal operation sub-period in which the output circuit transmits the first level to the output signal terminal under the control of the voltage at the first node; and a third normal operation sub-period in which the reset circuit transmits the second level to the first node; the control circuit transmits the first level to the second node under the control of the voltage at the first node and the voltage at the output signal terminal, and transmits the second level to the first node under the control of the voltage at the second node; and the output circuit transmits the second level to the output signal terminal under the control of the voltage at the second node.

According to a third aspect of the present disclosure, there is provided a shift register circuit comprising m cascaded shift register units according to the present disclosure, wherein an input signal terminal of a first stage of shift register unit is connected to a start signal terminal, an output signal terminal of the first stage of shift register unit is connected to an input signal terminal of a second stage of shift register unit, and a reset signal terminal of the first stage of shift register unit is connected to an output signal terminal of the second stage of shift register unit;

an input signal terminal of an $m^{th}$ stage of shift register unit is connected to an output signal terminal of an $(m-1)^{th}$ stage of shift register unit, and an output signal terminal of the $m^{th}$ stage of shift register unit is connected to a reset signal terminal of the $(m-1)^{th}$ stage of shift register unit; and an input signal terminal of an $n^{th}$ stage of shift register unit is connected to an output signal terminal of an $(n-1)^{th}$ stage of shift register unit, an output signal terminal of the $n^{th}$ stage of shift register unit is connected to an input signal terminal of an $(n+1)^{th}$ stage of shift register unit, and a reset signal terminal of the $n^{th}$ stage of shift register unit is connected to an output signal terminal of the $(n+1)^{th}$ stage of shift register unit, where m and n are integers greater than 1 and m is greater than n.

According to a fourth aspect of the present disclosure, there is provided a method for driving the shift register circuit according to the present disclosure, the method comprising:

inputting, in a starting-up reset phase, a first level to starting-up signal input terminals of the m cascaded shift register units of the shift register circuit;

inputting, in a reset phase by the first clock signal terminal, a first clock signal, and inputting, by the second clock signal terminal, a second clock signal; and in a normal operation phase, normally operating, by the shift register unit.

According to a fifth aspect of the present disclosure, there is provided a display apparatus comprising the shift register circuit according to the present disclosure.

BRIEF DESCRIPTION OF THE DRAWINGS

In order to more clearly describe the technical solutions in the embodiments of the present disclosure or in the related art, the accompanying drawings need to be used in the description of the embodiments of the present disclosure or the related art will be briefly described below. Obviously, the accompanying drawings in the following description are only some embodiments of the present disclosure, other accompanying drawings may also be obtained by those skilled in the art based on these accompanying drawings without any creative work.

Figure 7:
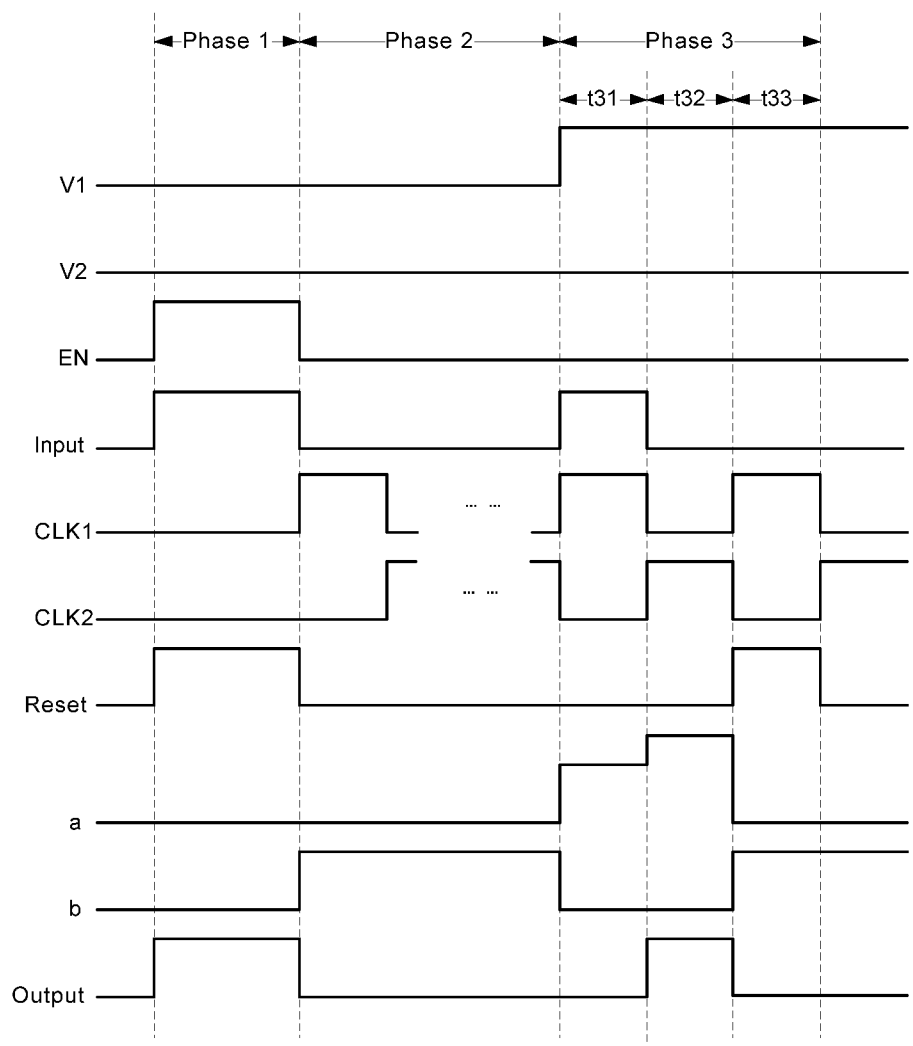
Figure 8:
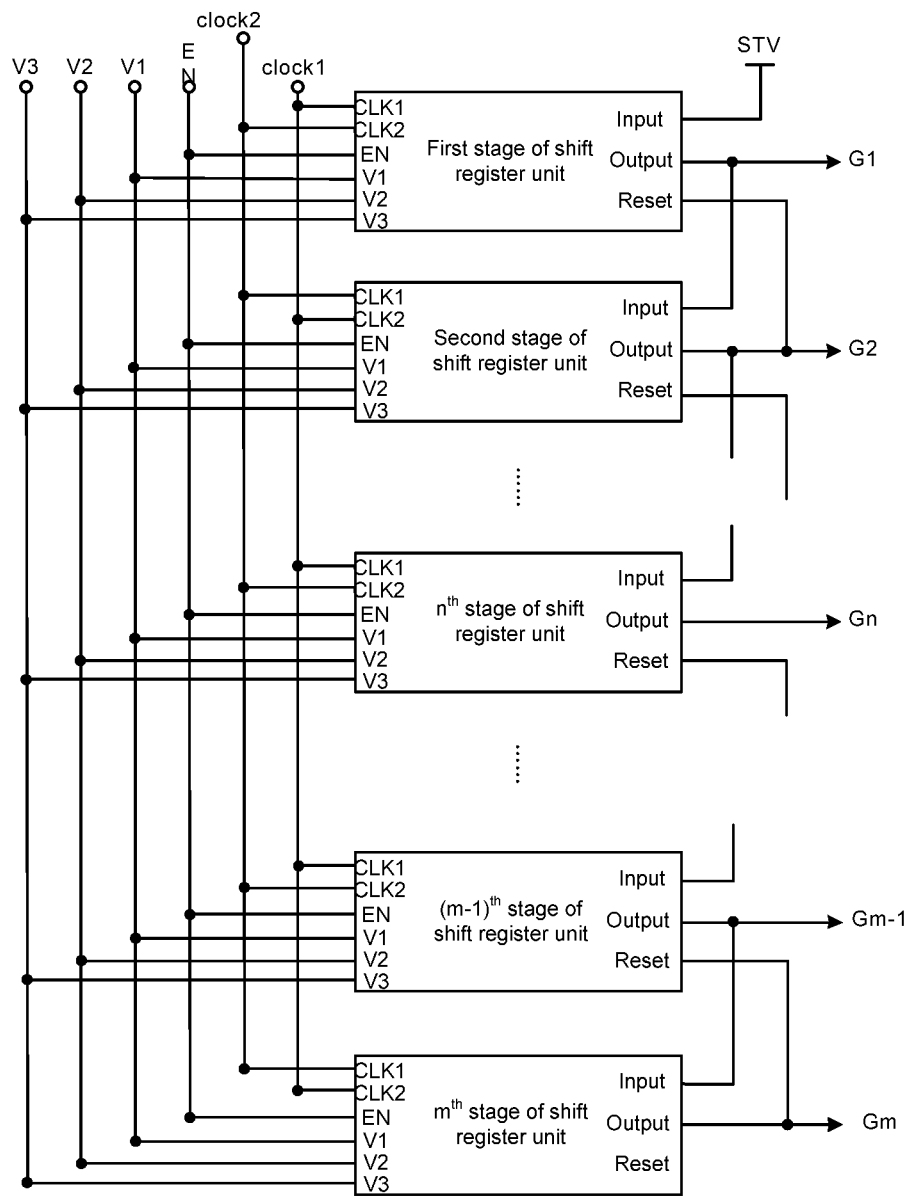
Figure 9:
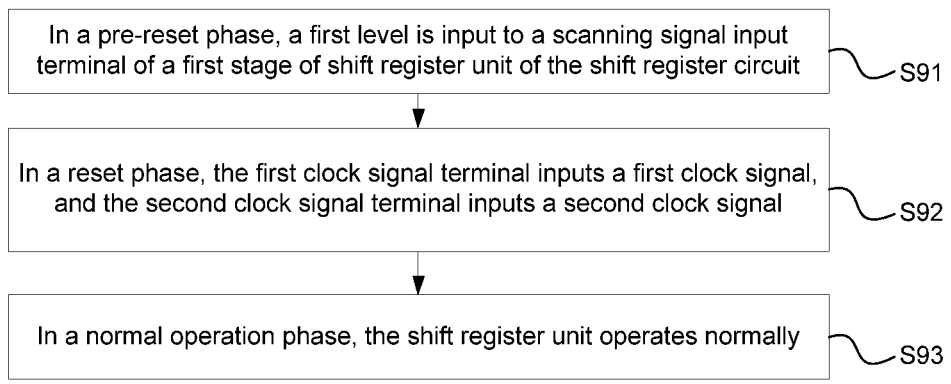

6 is a flowchart of steps of a method for driving a shift register unit according to another embodiment of the present disclosure;

FIG. 7 is a schematic diagram of timing states of signals of a shift register unit according to an embodiment of the present disclosure;

FIG. 8 is a schematic structural diagram of a shift register circuit according to an embodiment of the present disclosure; and FIG. 9 is a flowchart of steps of a method for driving a shift register circuit according to an embodiment of the present disclosure.

DETAILED DESCRIPTION

The embodiments of the present disclosure will be clearly and completely described below in conjunction with the accompanying drawings in the embodiments of the present disclosure. Obviously, the described embodiments are merely some but not all of the embodiments of the present disclosure. All other embodiments obtained by those of ordinary skill in the art based on the embodiments of the present disclosure without any creative effort shall fall within the protection scope of the present disclosure.

Transistors used in all the embodiments of the present disclosure may be Thin Film Transistors (TFTs for short) or field effect transistors or Metal-Oxide-Semiconductor (MOS for short) transistors, or other devices with the same characteristics. According to the role in the circuit, the transistors used in the embodiments of the present disclosure are primarily switch transistors. As a source and a drain of a switch transistor used here are symmetrical, its source and drain may be interchanged. In the embodiments of the present disclosure, in order to distinguish between two electrodes of a transistor except for a gate, a source of the two electrodes is referred to as a first electrode, and a drain of the two electrodes is referred to as a second electrode. According to a form in the accompanying drawings, an intermediate terminal of a transistor is defined as a gate, a signal input terminal of the transistor is defined as a source, and a signal output terminal of the transistor is defined as a drain. In addition, the switch transistors used in the embodiments of the present disclosure comprise P-type switch transistors and N-type switch transistors, wherein the P-type switch transistor is turned on when a gate is at a low level and is turned off when the gate is at a high level, and the N-type switch transistor is turned on when a gate is at a high level and is turned off when the gate is at a low level.

It should also be illustrated that, in order to facilitate the clear description of the technical solutions according to the embodiments of the present disclosure, in the embodiments of the present disclosure, the words "first", "second", etc. are used to distinguish between the same or similar items having substantially the same functions and roles, and those skilled in the art can understand that the words "first", "second", etc. do not limit the number and the execution order.

All of output signals of the shift register unit circuit in the related art are at a low level at the time of power-on, and therefore all of Thin Film Transistors (TFTs for short) in the shift register unit are in a non-operating state, thereby resulting in the inability to determine states of a pull-up node and a pull-down node in the shift register unit. If various output signal terminals of the shift register unit input a driving signal according to a driving timing at this time, it may cause an unstable output of the shift register unit, thereby causing abnormal display of the display panel.

Figure 1:
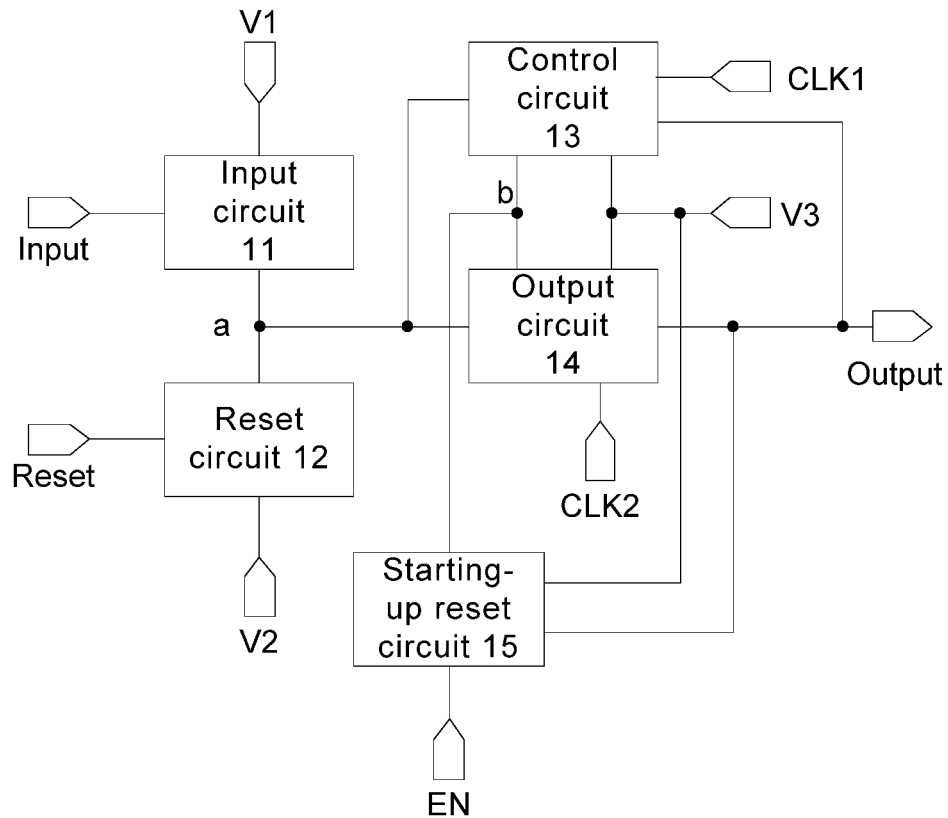
FIG. 1 is a schematic structural diagram of a shift register unit according to an embodiment of the present disclosure.

The embodiments of the present disclosure provide a shift register unit. As shown in FIG. 1, the shift register unit comprises an input circuit 11, a reset circuit 12, a control circuit 13, an output circuit 14, and a starting-up reset circuit 15.

A connection relationship of various functional circuits in the shift register unit will be described in detail below with reference to FIG. 1.

The input circuit 11 is connected to a first level terminal V1, an input signal terminal Input, and a first node a.

The reset circuit 12 is connected to a second level terminal V2, a reset signal terminal Reset, and the first node a.

The control circuit 13 is connected to a first clock signal terminal CLK1, an output signal terminal Output, a third level terminal V3, the first node a, and a second node b.

The output circuit 14 is connected to a second clock signal terminal CLK2, the first node a, the output signal terminal Output, the third level terminal V3, and the second node b.

The starting-up reset circuit 15 is connected to a starting-up signal terminal EN, the output signal terminal Output, the second node b, and the third level terminal V3.

Further, functions of the above functional circuits in the shift register unit will be described in detail below.

The starting-up reset circuit 15 is configured to transmit a voltage at the third level terminal V3 to the second node b and output, at the output signal terminal Output, a starting-up signal at the starting-up signal terminal EN under a control of the starting-up signal. The reset circuit 12 is configured to transmit a voltage at the second level terminal V2 to the first node a under a control of a reset signal at the reset signal terminal Reset. The input circuit 11 is configured to transmit a voltage at the first level terminal V1 to the first node a under a control of an input signal at the input signal terminal Input.

The control circuit 13 is configured to transmit a first clock signal at the first clock signal terminal CLK1 to the second node b under a control of a voltage at the first node a, a voltage at the output signal terminal Output, and the first clock signal at the first clock signal terminal CLK1, and transmit the voltage at the third level terminal V3 to the first node a under a control of a voltage at the second node b. The output circuit 14 is configured to transmit the voltage at the third level terminal V3 to the output signal terminal Output under the control of the voltage at the second node b.

The shift register unit according to the embodiments of the present disclosure outputs a gate driving signal, and functions of various functional circuits in the shift register unit in a phase in which the shift register unit outputs the gate driving signal will be further described in detail in the embodiments of the present disclosure. For example, the phase in which the shift register unit outputs the gate driving signal may comprise a first time period, a second time period, and a third time period.

In the first time period, the input circuit 11 is configured to transmit the voltage at the first level terminal V1 to the first node a under the control of the input signal at the input signal terminal Input. The control circuit 13 is configured to transmit the voltage at the third level terminal V3 to the second node b under the control of the voltage at the first node a.

In the second time period, the output circuit 14 is configured to output, at the output signal terminal Output, the voltage at the second clock signal terminal CLK2 as the gate driving signal under the control of the voltage at the first node a.

In the third time period, the reset circuit 13 is configured to transmit the voltage at the second level terminal V2 to the first node a under the control of the reset signal at the reset signal terminal Reset. The control circuit 13 is configured to transmit the first clock signal at the first clock signal terminal CLK1 to the second node b under the control of the voltage at the first node a, the voltage at the output signal terminal Output, and the first clock signal output by the first clock signal terminal CLK1, and transmit the voltage at the third level terminal V3 to the first node a under the control of the voltage at the second node b. The output circuit 14 is configured to transmit the voltage at the third level terminal V3 to the output signal terminal Output under the control of the voltage at the second node b.

In the shift register unit according to the embodiments of the present disclosure, the functions in the starting-up reset phase and the reset phase may be implemented through the starting-up reset circuit, the reset circuit, and the input circuit when the display is powered on, so as to reset the voltages at the first node, the second node, and the output signal terminal. Therefore, according to the technical solutions of the embodiments of the present disclosure, an operating signal output by the shift register unit prior to a normal operation can be avoided, thereby improving the problem of abnormal display of the display panel due to an unstable output of the register at the time of power-on.

Figure 2:
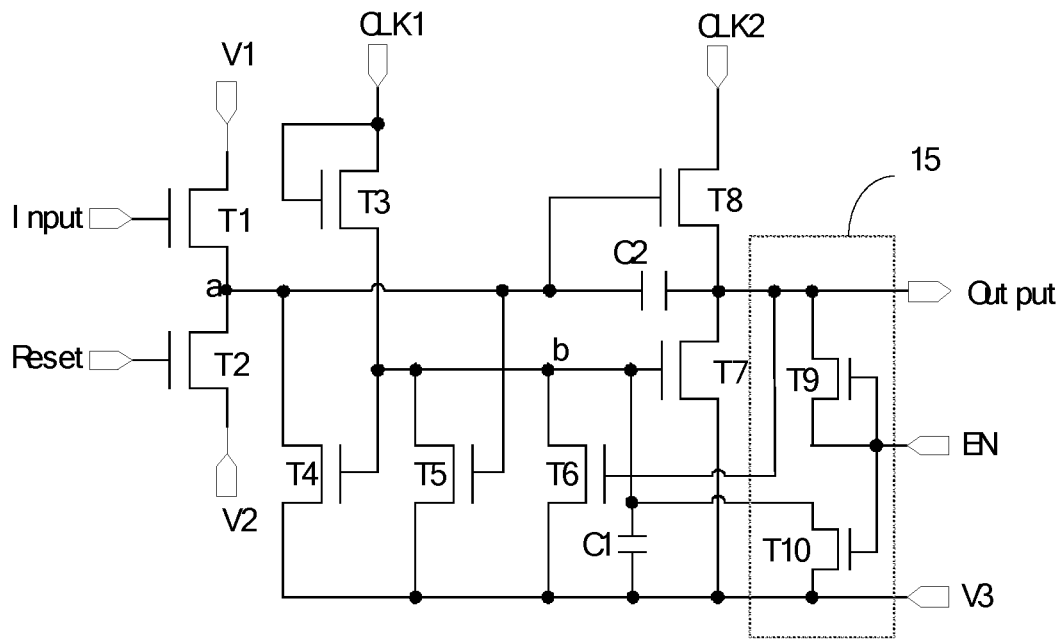
FIG. 2 is a shift register unit circuit according to an embodiment of the present disclosure.

Further, the embodiments of the present disclosure further provide an exemplary circuit of a shift register unit. As shown in FIG. 2, the input circuit 11 comprises a first transistor T1. The first transistor T1 has a first electrode connected to the first level terminal V1, a second electrode connected to the first node a, and a gate connected to the input signal terminal Input.

The reset circuit 12 comprises a second transistor T2. The second transistor T2 has a first electrode connected to the second level terminal V2, a second electrode connected to the first node a, and a gate connected to the reset signal terminal Reset.

The control circuit 13 comprises a third transistor T3, a fourth transistor T4, a fifth transistor T5, a sixth transistor T6, and a first capacitor C1. The third transistor T3 has a first electrode connected to the first clock signal terminal CLK1, a second electrode connected to the second node b, and a gate connected to the first clock signal terminal CLK1. The fourth transistor T4 has a first electrode connected to the first node a, a second electrode connected to the third level terminal V3, and a gate connected to the second node b. The fifth transistor T5 has a first electrode connected to the first node a, a second electrode connected to the third level terminal V3, and a gate connected to the first node a. The sixth transistor T6 has a first electrode connected to the second node b, a second electrode connected to the third level terminal V3, and a gate connected to the output signal terminal Output. The first capacitor C1 has a first electrode connected to the second node b, and a second electrode connected to the third level terminal V3.

The output circuit 14 comprises a seventh transistor T7, an eighth transistor T8, and a second capacitor C2. The seventh transistor T7 has a first electrode connected to the output signal terminal Output, a second electrode connected to the third level terminal V3, and a gate connected to the second node b. The eighth transistor T8 has a first electrode connected to the second clock signal terminal CLK2, a second electrode connected to the output signal terminal Output, and a gate connected to the first node a. The second capacitor C2 has a first electrode connected to the first node a, and a second electrode connected to the output signal terminal Output.

As shown in FIG. 2, the starting-up reset circuit 15 comprises a ninth transistor 9 and a tenth transistor 10. The ninth transistor T9 has a first electrode connected to the output signal terminal Output, a second electrode connected to the starting-up signal terminal EN, and a gate connected to the starting-up signal terminal EN. The tenth transistor T10 has a first electrode connected to the second node b, a second electrode connected to the third level terminal V3, and a gate connected to the starting-up signal terminal EN.

Figure 3:
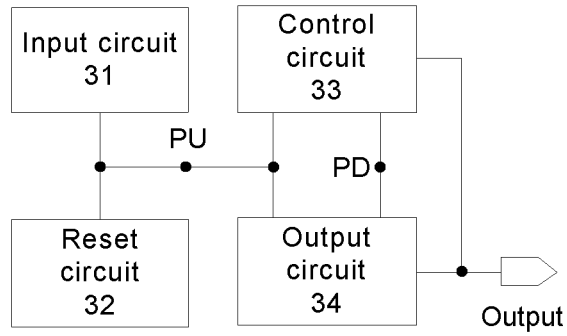
FIG. 3 is a schematic structural diagram of a shift register unit according to another embodiment of the present disclosure.

The embodiments of the present disclosure provide a method for driving a shift register unit. As shown in FIG. 3, the shift register unit comprises an input circuit 31, a reset circuit 32, a control circuit 33, and an output circuit 34, wherein the input circuit 31, the reset circuit 32, the control circuit 33, and the output circuit 34 are connected to a first node PU, the control circuit 33 and the output circuit 34 are connected to a second node PD, and the control circuit 33 and the output circuit 34 are connected to an output signal terminal Output.

The first node PU is configured to control the control circuit 33 so that the output circuit 34 outputs a pull-up signal at the output signal terminal Output under the control of the input circuit 31. The second node PD is configured to cause the output circuit 34 to output a pull-down signal at the output signal terminal Output under the control of the control circuit 33, and the reset circuit 32 is configured to reset the first node PU and the output signal terminal Output.

The pull-up signal and the pull-down signal are used to control a turn-on/turn-off state of a transistor connected to the output signal terminal of the shift register unit. For example, when the pull-up signal is output by the output signal terminal of the shift register unit, the transistor which is connected to the output signal terminal of the shift register unit through a gate line is in a turn-on state, and when the pull-down signal is output by the output signal terminal of the shift register unit, the transistor which is connected to the output signal terminal of the shift register unit through the gate line is in a turn-off state. For example, when the transistor which is connected to the output signal terminal of the shift register unit through the gate line is an N-type transistor, the pull-up signal is at a high level and the pull-down signal is at a low level; and when the transistor which is connected to the output signal terminal of the shift register unit through the gate line is a P-type transistor, the pull-up signal is at a low level and the pull-down signal is at a high level.

Figure 4:
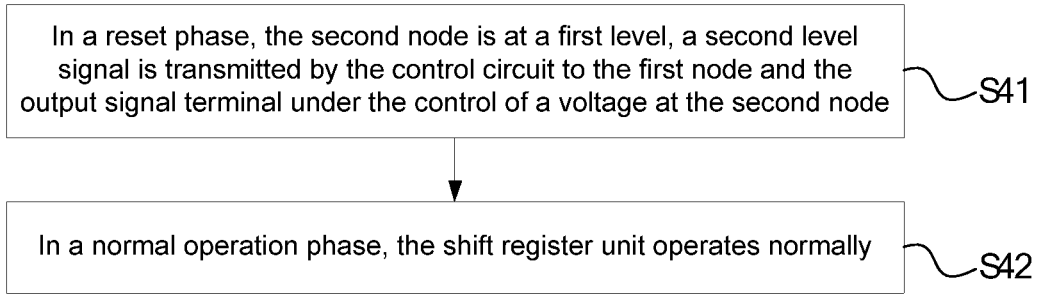
FIG. 4 is a flowchart of steps of a method for driving a shift register unit according to an embodiment of the present disclosure.

As shown in FIG. 4, the method for driving a shift register unit may comprise the following steps.

In a reset phase S41, the second node is at a first level, a second level signal is transmitted by the control circuit to the first node and the output signal terminal under the control of a voltage at the second node.

For example, the above step S41 may comprise: transmitting, by the control circuit 43, the first level to the second node PD under the control of a voltage at the first node PU and a voltage at the output signal terminal Output, and transmitting the second level to the first node PU and the output signal terminal Output under the control of the voltage at the second node PD.

In a normal operation phase S42, the shift register unit operates normally.

For example, the above step S42 may comprise the following phases.

In a first phase, the input circuit 31 transmits the first level to the first node PU, and the control circuit 33 transmits the second level to the second node PD under the control of the voltage at the first node PU.

In a second phase, the output circuit 34 transmits the first level to the output signal terminal Output under the control of the voltage at the first node PU.

In a third phase, the reset circuit 32 transmits the second level to the first node PU; the control circuit 33 transmits the first level to the second node PD under the control of the voltage at the first node PU and the voltage at the output signal terminal Output, and transmits the second level to the first node PU under the control of the voltage at the second node PD; and the output circuit 34 transmits the second level to the output signal terminal Output under the control of the voltage at the second node PD.

It should be illustrated that in the above embodiments, if each transistor in the shift register unit is an N-type transistor, the first level is a high level and the second level is a low level in the above embodiments. If each transistor in the shift register unit is a P-type transistor, the signal needs to be adjusted to be a signal with an opposite phase in the process of driving the shift register unit, that is, when each transistor in the shift register unit is a P-type transistor, the first level is a low level and the second level is a high level in the above embodiments.

In the method for driving a shift register unit according to the embodiments of the present disclosure, the first node and the second node may be reset at the time of power-on, so that the shift register unit outputs an inactive operation signal. Therefore, according to the method for driving a shift register unit according to the embodiments of the present disclosure, an operating signal output by the shift register unit prior to a normal operation can be avoided, thereby improving the problem of abnormal display of the display panel due to an unstable output of the register at the time of power-on.

Figure 5:
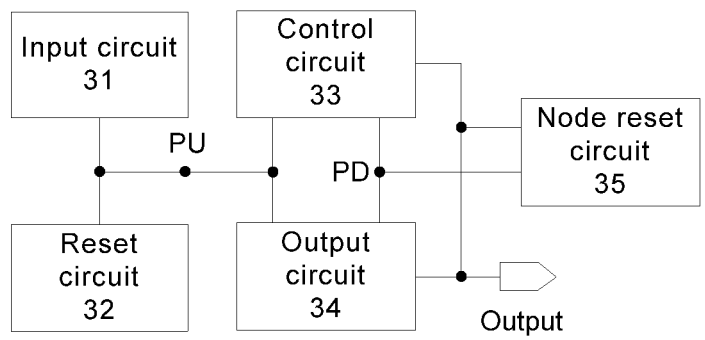
FIG. 5 is a schematic structural diagram of a shift register unit according to another embodiment of the present disclosure.

Further, as shown in FIG. 5, the shift register unit shown in FIG. 4 further comprises a starting-up reset circuit 35 connected to the second node PD and the output signal terminal Output.

Figure 6:
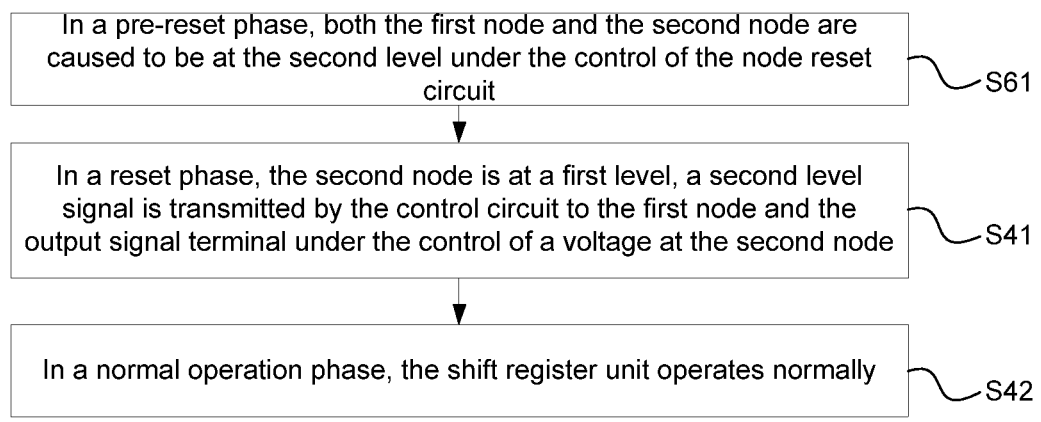

As shown in FIG. 6, prior to the reset phase, the driving method may further comprise the following steps.

In a starting-up reset phase S61, both the first node PU and the second node PD are caused to be at the second level under the control of the starting-up reset circuit 35.

For example, in the starting-up reset phase described above, both the first node and the second node are caused to be at the second level under the control of the starting-up reset circuit. This step may comprise transmitting, by the starting-up reset circuit 35, the first level to the output signal terminal Output, and transmitting the second level to the second node PD; and transmitting, by the reset circuit 12 and the input circuit 11, the second level to the first node PU.

An operation principle of the shift register unit according to the embodiment of the present disclosure will be described below with reference to a timing state diagram shown in FIG. 7. The operation principle will be described by taking each of the transistors in the shift register unit shown in FIG. 2 being an N-type transistor which is turned on when a gate is at a high level as an example. FIG. 7 illustrates timing states of a voltage signal at the first level terminal V1, a voltage signal at the second level terminal V2, a starting-up signal at the starting-up signal terminal EN, an input signal at the input signal terminal Input, a first clock signal at the first clock signal terminal CLK1, a second clock signal at the second clock signal terminal CLK2, an output signal at the output signal terminal Output, a voltage at the first node a, and a voltage at the second node b. The second level terminal V2 and the third level terminal V3 provide a stable low level. As an example, the second level terminal V2 and the third level terminal V3 may be connected to the ground. As shown in FIG. 7, the timing may comprise a first phase (starting-up reset phase); a second phase (reset phase); and a third phase (normal operation phase), wherein the third phase further comprises a first normal operation sub-period t31, a second normal operation sub-period t32 and a third normal operation sub-period t33.

In the first phase (starting-up reset phase), the starting-up signal terminal EN inputs a high level, and therefore the ninth transistor T9 and the tenth transistor T10 are turned on. As the output signal terminal Output is connected to the starting-up signal terminal EN through the ninth transistor T9, the output signal terminal Output outputs a high level at the starting-up signal terminal EN. The second node b is connected to the third level terminal V3 through the tenth transistor T10, and therefore the third level terminal V3 resets the voltage at the second node b to a low level. In addition, the reset signal terminal Reset inputs a high level, the input signal terminal Input inputs a high level, and therefore the first transistor T1 and the second transistor T2 are turned on, and the first node a is connected to the first level terminal through the first transistor T1 and is connected to the second level terminal V2 through the second transistor T2. In this phase, both the first level terminal V1 and the second level terminal V2 are at a low level, thereby resetting the voltage at the first node a to a low level. It should also be illustrated that, when m shift register units are cascaded to form a shift register circuit, the operation principle of the shift register unit described above corresponds to those of second to $(m-1)^{th}$ shift register units in the shift register circuit. Operation principles of a first stage of shift register unit and an $m^{th}$ stage of shift register unit are slightly different in that in the first phase, an input signal terminal Input of the first stage of shift register unit inputs a low level, and a reset signal terminal Reset of the $m^{th}$ stage of shift register unit inputs a low level. However, as both the first level terminal V1 and the second level terminal V2 are at a low level in this phase, even if the reset signal terminal Reset or the input signal terminal Input inputs a low level, the voltage at the first node a may still be reset to a low level. Therefore, the voltage at the first node a of the first stage of shift register unit and the voltage at the first node a of the $m^{th}$ stage of shift register unit may also be reset to a low level in this phase.

In the second phase (reset phase), the first clock signal terminal CLK1 starts outputting a first clock signal, and the second clock signal terminal CLK2 starts outputting a second clock signal. Both the first clock signal and the second clock signal have a duty cycle of 50%, and the first clock signal and the second clock signal have opposite phases.

When the first clock signal at the first clock signal terminal CLK1 is at a high level and the second clock signal at the second clock signal terminal CLK2 is at a low level, the third transistor T3 is turned on, the second node b is connected to the first clock signal terminal CLK1 through the third transistor T3, and the first clock signal terminal CLK1 pulls the voltage at the second node b to a high level. The second node b is at a high level, and therefore the fourth transistor T4 is turned on, the first node a is connected to the third level terminal V3 through the fourth transistor T4, and the third level terminal V3 pulls the voltage at the first node a to a low level. The seventh transistor T7 is turned on, the output signal terminal Output is connected to the third level terminal V3 through the seventh transistor T7, and the third level terminal V3 pulls the voltage at the output signal terminal Output to a low level. In addition, when the control circuit comprises the first capacitor C1, the first capacitor C1 is charged.

When the second clock signal at the second clock signal terminal CLK2 is at a high level and the first clock signal at the first clock signal terminal CLK1 is at a low level, the second node b is maintained at a high level, the first node a is maintained at a low level, the eighth transistor T8 is turned off, the second clock signal output by the second clock signal terminal CLK2 cannot enter the GOA circuit through the eighth transistor T8, and therefore, when the second clock signal at the second clock signal terminal CLK2 is at a high level, the output signal terminal Output is maintained at a low level. In addition, when the control circuit comprises the first capacitor C1, as the first clock signal at the first clock signal terminal CLK1 is at a high level, the first capacitor C1 is charged, and when the second clock signal at the second clock signal terminal CLK2 is at a high level, the first capacitor C1 has no discharge path, and therefore can better maintain the second node b at a high level.

As in the second phase, the voltage at the first node may be pulled to a low level and the voltage at the second node may be pulled to a high level, it can be ensured that the output signal terminal Output outputs a stable low level. Therefore, the GOA circuit and the method for driving a GOA circuit according to the embodiments of the present disclosure can improve the problem of abnormal display due to an unstable output of the GOA circuit at the time of power-on.

In addition, a number of periods including the clock signal in the second phase may be set to any number according to practical requirements, and the number of periods including the clock signal in the second phase is not limited in the embodiments of the present disclosure.

In a first normal operation sub-period t31 of the third phase (normal operation phase), the input signal terminal Input outputs a high level, the first level terminal V1 outputs a high level, the first transistor T1 is turned on, the first node a is connected to the first level terminal through the first transistor T1, and the first level terminal V1 pulls the first node a to a high level. At the same time, the second capacitor C2 is charged. As the first node a is at a high level, the fifth transistor T5 and the eighth transistor T8 are turned on, the second node b is connected to the third level terminal V3 through the fifth transistor T5, and the third level terminal V3 pulls the second node to a low level. In this phase, the first clock signal at the first clock signal terminal CLK1 is at a high level, the second clock signal at the second clock signal terminal CLK2 is at a low level, and therefore the output signal terminal outputs a low level.

In a second normal operation sub-period t32 of the third phase (normal operation phase), the input signal terminal Input outputs a low level, the first transistor T1 is turned off, the first clock signal at the first clock signal terminal CLK1 is at a low level, the fourth transistor T4 is turned off, and the second capacitor C2 has no discharge path and therefore maintains the first node a at a high level. The second clock signal at the second clock signal terminal CLK2 is at a high level, and therefore a voltage at a second electrode of the second capacitor C2 rises, and due to the bootstrap effect of the capacitor, a voltage at a first electrode (i.e., the first node) of the second capacitor C2 further rises, and the eighth transistor T8 is turned on more fully. The output signal terminal Output is connected to the second clock signal terminal through the eighth transistor T8, and outputs a high level at the second clock signal terminal CLK2.

In a third normal operation sub-period t33 of the third phase (normal operation phase), the reset signal input Reset inputs a high level, and therefore the second transistor T2 is turned on, the first node a is connected to the second level terminal V2 through the second transistor T2, and the first node a is pulled to a low level. When the first clock signal at the first clock signal terminal CLK1 is at a high level, the third transistor T3 is turned on, the second node b is connected to the first clock signal terminal CLK1 through the third transistor T3, and the first clock signal terminal CLK1 pulls the voltage at the second node b to a high level. As the second node b is at a high level, the fourth transistor T4 and the seventh transistor T7 are turned on, the first node a is connected to the third level terminal V3 through the fourth transistor T4, the voltage at the first node a is further pulled down, and the output signal terminal Output is connected to the third level terminal V3 through the seventh transistor T7 and outputs a low level.

A period from the start of the first normal operation sub-period t31 to the time when the input signal terminal INPUT of the current stage of shift register unit inputs a high level again may be treated as a complete operation period of the current stage of shift register unit. Therefore, one operation period of the current stage of shift register unit after the third normal operation sub-period t33 may further comprise several phases, which are determined by a number of rows scanned by the shift register circuit. However, before the input signal terminal Input of the current stage of GOA circuit inputs a high level again after the third normal operation sub-period t33, the output signal terminal Output of the current stage of shift register unit is maintained at a low level (and outputs an inactive operation signal).

Further, all the transistors in the shift register unit in the above embodiments may also be P-type transistors which are turned on at a low level. If all the transistors are P-type transistors, it only needs to readjust the timing state of each input signal of the shift register unit.

Further, both of N-type transistors and P-type transistors may also be used in the shift register unit. At this time, it needs to ensure that transistors which are controlled by the same timing signal or voltage in the shift register unit need to be the same type of transistors. As active layers of different types of transistors may be of different doping materials, the use of a uniform type of transistors in the shift register unit is more advantageous to simplify the production process of the shift register unit.

In addition, it also needs to be illustrated that in the above embodiments, an operation principle of the method for driving the shift register unit shown in FIG. 6 should be described by taking the shift register unit shown in FIG. 2 as an example; however the present disclosure is not limited thereto.

Yet another embodiment of the present disclosure provides a shift register circuit. As shown in FIG. 8, the shift register circuit comprises m cascaded shift register units according to the above embodiments. An input signal terminal of a first stage of shift register unit is connected to a start signal terminal, an output signal terminal of the first stage of shift register unit is connected to an input signal terminal of a second stage of shift register unit, and a reset signal terminal of the first stage of shift register unit is connected to an output signal terminal of the second stage of shift register unit; an input signal terminal of an $m^{th}$ stage of shift register unit is connected to an output signal terminal of an $(m-1)^{th}$ stage of shift register unit, and an output signal terminal of the $m^{th}$ stage of shift register unit is connected to a reset signal terminal of the $(m-1)^{th}$ stage of shift register unit; and an input signal terminal of an $n^{th}$ stage of shift register unit is connected to an output signal terminal of an $(n-1)^{th}$ stage of shift register unit, an output signal terminal of the $n^{th}$ stage of shift register unit is connected to an input signal terminal of an $(n+1)^{th}$ stage of shift register unit, and a reset signal terminal of the $n^{th}$ stage of shift register unit is connected to an output signal terminal of the $(n+1)^{th}$ stage of shift register unit, where m and n are integers greater than 1 and m is greater than n.

For example, as shown in FIG. 8, an input signal terminal of a first stage of shift register unit is connected to a start signal terminal STV, an output signal terminal of the first stage of shift register unit is connected to an input signal terminal of a second stage of shift register unit and a gate line G1, and a reset signal terminal of the first stage of shift register unit is connected to an output signal terminal of the second stage of shift register unit; an input signal terminal of an $n^{th}$ stage of shift register unit is connected to an output signal terminal of an $(n-1)^{th}$ stage of shift register unit, an output signal terminal of the $n^{th}$ stage of shift register unit is connected to an input signal terminal of an $(n+1)^{th}$ stage of shift register unit, and a reset signal terminal of the $n^{th}$ stage of shift register unit is connected to an output signal terminal of the $(n+1)^{th}$ stage of shift register unit; and an input signal terminal of an $m^{th}$ stage of shift register unit (a last stage of shift register unit) is connected to an output signal terminal of an $(m-1)^{th}$ stage of shift register unit, and an output signal terminal of the m$^{th}$ stage of shift register unit is connected to an input signal terminal of the (m−1)$^{th}$ stage of shift register unit and a gate line Gm.

In addition, each shift register unit comprises a first clock signal terminal CLK1 and a second clock signal terminal CLK2. As shown in FIG. 8, clock signals clock1 and clock2 of two systems are provided to the two clock signal terminals connected to each shift register unit through the clock signals, wherein CLK1 of an (2n−1)$^{th}$ stage of shift register unit inputs clock1, CLK2 of the (2n−1)$^{th}$ stage of shift register unit inputs clock2, CLK1 of an (2n)$^{th}$ stage of shift register unit inputs clock2, and CLK2 of the (2n)$^{th}$ stage of shift register unit inputs clock1.

A timing state of a system clock can be known with reference to the first clock signal at the first clock signal terminal CLK1 and the second clock signal at the second clock signal terminal CLK2 in FIG. 7. Clock1 and clock2 have opposite phases, and clock1 and clock2 are clock signals with a duty cycle of 50%.

An embodiment of the present disclosure provides a method for driving a shift register circuit. The method for driving a shift register circuit is configured to drive the shift register circuit shown in FIG. 8. For example, as shown in FIG. 9, the method may comprise the following steps.

In a starting-up reset phase S91, a first level is input to starting-up signal input terminals of the m shift register units of the shift register circuit.

When the first level is input to the starting-up signal input terminals of the shift register units of the shift register circuit, a starting-up reset unit of the first stage of shift register unit transmits the first level to an output signal terminal of the first stage of shift register unit, the output signal terminals of the shift register units then transmits the first level to an input signal terminal of a second stage of shift register unit, which continues to transmit the low level, and so on, so that output signal terminals of all the shift register units in the shift register circuit output the first level.

In addition, other control processes and principles of each shift register unit in the shift register circuit can be known with reference to any method for driving a shift register unit described above, which will not be described again in the present disclosure.

In a reset phase S92, the first clock signal terminal inputs a first clock signal, and the second clock signal terminal inputs a second clock signal.

In a normal operation phase S93, the shift register unit operates normally.

Other control processes and principles of each shift register unit in the shift register circuit can be known with reference to any method for driving a shift register unit described above, which will not be described again in the present disclosure.

An embodiment of the present disclosure provides a display apparatus comprising the shift register circuit according to the above embodiments.

In addition, the display apparatus may be any product or component having a display function such as an electronic paper, a mobile phone, a tablet computer, a television, a display, a notebook computer, a digital photo frame, a navigator, etc.

The foregoing descriptions are merely specific implementations of the present disclosure, but the protection scope of the present disclosure is not limited thereto. Changes or substitutions which can be easily reached by any skilled in the art should fall within the protection scope of the present disclosure. Therefore, the protection scope of the present disclosure should be based on the protection scope of the claims.

We claim:

1. A shift register unit for a display panel, comprising:
an input circuit electrically connected to a first level terminal, an input signal terminal configured to provide a first clock signal, and a first node;
a control circuit electrically connected to a first clock signal terminal configured to provide the first clock signal, an output signal terminal, a third level terminal, the first node, and a second node;
an output circuit electrically connected to a second clock signal terminal configured to provide a second clock signal, the first node, the second node, the third level terminal, and the output signal terminal; and
a starting-up reset circuit electrically connected to a starting-up signal terminal configured to provide a starting-up signal, the output signal terminal, the second node, and the third level terminal,
wherein, the starting-up reset circuit is configured to transmit a voltage at the third level terminal to the second node and output, at the output signal terminal, the starting-up signal under a control of the starting-up signal;
wherein the input circuit is configured to transmit a voltage at the first level terminal to the first node under a control of an input signal at the input signal terminal;
wherein, the control circuit is configured to transmit the first clock signal to the second node under a control of a voltage at the first node, a voltage at the output signal terminal, and the first clock signal at the first clock signal terminal, and transmit the voltage at the third level terminal to the first node under a control of a voltage at the second node; and
wherein the output circuit is configured to transmit the voltage at the third level terminal to the output signal terminal under the control of the voltage at the second node;
wherein the starting-up reset circuit comprises a ninth transistor and a tenth transistor,
wherein the ninth transistor has a first electrode connected to the output signal terminal, a second electrode connected to the starting-up signal terminal, and a gate connected to the starting-up signal terminal; and
the tenth transistor has a first electrode connected to the second node, a second electrode connected to the third level terminal, and a gate connected to the starting-up signal terminal.

2. The shift register unit according to claim 1, wherein the input circuit comprises a first transistor having a first electrode connected to the first level terminal, a second electrode connected to the first node, and a gate connected to the input signal terminal.

3. The shift register unit according to claim 1, further comprising a reset circuit electrically connected to a second level terminal, a reset signal terminal configured to provide a reset signal, and the first node;
wherein the reset circuit comprises a second transistor having a first electrode connected to the second level terminal, a second electrode connected to the first node, and a gate connected to the reset signal terminal.

4. The shift register unit according to claim 1, wherein the control circuit comprises a third transistor, a fourth transistor, a fifth transistor, a sixth transistor, and a first capacitor, wherein the third transistor has a first electrode connected to the first clock signal terminal, a second electrode connected to the second node, and a gate connected to the first clock signal terminal;

the fourth transistor has a first electrode connected to the first node, a second electrode connected to the third level terminal, and a gate connected to the second node;

the fifth transistor has a first electrode connected to the first node, a second electrode connected to the third level terminal, and a gate connected to the first node;

the sixth transistor has a first electrode connected to the second node, a second electrode connected to the third level terminal, and a gate connected to the output signal terminal; and the first capacitor has a first electrode connected to the second node, and a second electrode connected to the third level terminal.

5. The shift register unit according to claim 1, wherein the output circuit comprises a seventh transistor, an eighth transistor, and a second capacitor, wherein the seventh transistor has a first electrode connected to the output signal terminal, a second electrode connected to the third level terminal, and a gate connected to the second node;

the eighth transistor has a first electrode connected to the second clock signal terminal, a second electrode connected to the output signal terminal, and a gate connected to the first node; and the second capacitor has a first electrode connected to the first node, and a second electrode connected to the output signal terminal.

6. The shift register unit according to claim 2, wherein each transistor of the shift register unit is an N-type transistor, the first level is a high level, and the second level is a low level.

7. The shift register unit according to claim 2, wherein each transistor of the shift register unit is a P-type transistor, the first level is a low level, and the second level is a high level.

8. A method for driving the shift register unit, of claim 1, the driving method comprising:

in a starting-up-reset phase, causing both the first node and the second node to be at the second level under the control of the starting-up reset circuit.

9. The method according to claim 8, wherein subsequent to the starting-up-reset phase, the method further comprises a reset phase in which the second node is at a first level, transmitting, by the control circuit, a second level signal to the first node and the output signal terminal under the control of a voltage at the second node.

10. The method according to claim 9, wherein the second node is at the first level, and transmitting, by the control circuit, a second level signal to the first node and the output signal terminal under the control of the voltage at the second node comprises:

transmitting, by the control circuit, the first level to the second node under the control of a voltage at the first node and a voltage at the output signal terminal, and transmitting the second level to the first node and the output signal terminal under the control of the voltage at the second node.

11. The method according to claim 9, wherein in the starting-up reset phase, causing both the first node and the second node to be at the second level under the control of the starting-up reset circuit comprises:

transmitting, by the starting-up reset circuit, the first level to the output signal terminal, and transmitting the second level to the second node; and transmitting, by the reset circuit and the input circuit, the second level to the first node.

12. The method according to claim 8, further comprising a normal operation phase-comprising:

a first normal operation sub-period in which the input circuit transmits the first level to the first node, and the control circuit transmits the second level to the second node under the control of the voltage at the first node;

a second normal operation sub-period in which the output circuit transmits the first level to the output signal terminal under the control of the voltage at the first node; and a third normal operation sub-period in which the reset circuit transmits the second level to the first node; the control circuit transmits the first level to the second node under the control of the voltage at the first node and the voltage at the output signal terminal, and transmits the second level to the first node under the control of the voltage at the second node; and the output circuit transmits the second level to the output signal terminal under the control of the voltage at the second node.

13. A shift register circuit comprising m cascaded shift register units according to claim 1, wherein an input signal terminal of a first stage of shift register unit is connected to a start signal terminal, an output signal terminal of the first stage of shift register unit is connected to an input signal terminal of a second stage of shift register unit, and a reset signal terminal of the first stage of shift register unit is connected to an output signal terminal of the second stage of shift register unit;

an input signal terminal of an mth stage of shift register unit is connected to an output signal terminal of an (m−1)th stage of shift register unit, and an output signal terminal of the mth stage of shift register unit is connected to a reset signal terminal of the (m−1)th stage of shift register unit; and an input signal terminal of an nth stage of shift register unit is connected to an output signal terminal of an (n−1)th stage of shift register unit, an output signal terminal of the nth stage of shift register unit is connected to an input signal terminal of an (n+1)th stage of shift register unit, and a reset signal terminal of the nth stage of shift register unit is connected to an output signal terminal of the (n+1)th stage of shift register unit, where m and n are integers greater than 1 and m is greater than n.

14. A method for driving the shift register circuit according to claim 13, the method comprising:

inputting, in a starting-up reset phase, a first level to a starting-up signal input terminal of the shift register units of the shift register circuit;

inputting, in a reset phase by the first clock signal terminal, the first clock signal, and inputting, by the second clock signal terminal, the second clock signal; and in a normal operation phase, normally operating, by the shift register unit.

15. A display apparatus comprising the shift register circuit according to claim 13.

* * * * *